(12) United States Patent
Okuyama et al.

(10) Patent No.: US 7,695,991 B2
(45) Date of Patent: Apr. 13, 2010

(54) METHOD FOR MANUFACTURING GAN SEMICONDUCTOR LIGHT-EMITTING ELEMENT

(75) Inventors: Hiroyuki Okuyama, Kanagawa (JP); Goshi Biwa, Kanagawa (JP)

(73) Assignee: Sony Corporation, Tokyo (JP)

( * ) Notice: Subject to any disclaimer, the term of this patent is extended or adjusted under 35 U.S.C. 154(b) by 710 days.

(21) Appl. No.: 11/463,233

(22) Filed: Aug. 8, 2006

(65) Prior Publication Data
US 2007/0037308 A1    Feb. 15, 2007

(30) Foreign Application Priority Data
Aug. 9, 2005    (JP)    ............... P2005-230415

(51) Int. Cl.
*H01L 21/00*    (2006.01)
(52) U.S. Cl. .............. 438/46; 438/481; 257/E21.09
(58) Field of Classification Search ............ 438/46, 438/47, 481; 257/E21.09
See application file for complete search history.

(56) References Cited

U.S. PATENT DOCUMENTS

| 6,072,189 | A | * | 6/2000 | Duggan ................... 257/14 |
| 2001/0030316 | A1 | * | 10/2001 | Kuramoto et al. .......... 257/12 |
| 2002/0022288 | A1 | * | 2/2002 | Hayashi et al. ............ 438/47 |
| 2002/0030200 | A1 | * | 3/2002 | Yamaguchi et al. ........ 257/184 |
| 2002/0190263 | A1 | * | 12/2002 | Hata et al. ................ 257/103 |
| 2003/0207125 | A1 | * | 11/2003 | Sunakawa et al. .......... 428/428 |
| 2004/0061119 | A1 | * | 4/2004 | Inoue et al. ............... 257/79 |

FOREIGN PATENT DOCUMENTS

| JP | 10-135576 | 5/1998 |
| JP | 11-340580 | 12/1999 |
| JP | 2000-294827 | 10/2000 |
| JP | 2001-217506 | 8/2001 |
| JP | 2002-100575 | 4/2002 |
| JP | 2002-305160 | 10/2002 |
| JP | 2003-158294 | 5/2003 |

OTHER PUBLICATIONS

M.D. Craven, S.H. Lim, F. Wu, J.S. Speck and S.P. DenBaars, Appl. Phys. Lett. 81 (2002), p. 469.*
Japanese Office Action issued on Apr. 28, 2009, for corresponding Japanese Patent Application No. 2005-230415.

* cited by examiner

*Primary Examiner*—Jarrett J Stark
(74) *Attorney, Agent, or Firm*—K&L Gates LLP (57) ABSTRACT

A method for manufacturing a GaN semiconductor light-emitting element is provided. The method for manufacturing a GaN semiconductor light-emitting element includes forming, by crystal growth, a first GaN compound semiconductor layer of a first conductivity type, the top face of which corresponds to the A plane, an active layer composed of $In_xGa_{(1-x)}N$, the top face of which corresponds to the A plane, and a second GaN compound semiconductor layer of a second conductivity type, the top face of which corresponds to the A plane, in that order on a base which is a nonpolar plane, wherein the active layer is formed at a crystal growth rate of 0.3 nm/sec or more.

7 Claims, 6 Drawing Sheets

FIG. 1A
[STEP-100]

FIG. 1B
[STEP-110]

FIG. 1C
[STEP-120]

FIG. 1D
[STEP-130]

FIG. 4A
[STEP-200]

FIG. 4B
[STEP-210]

FIG. 4C
[STEP-220]

FIG. 4D
[STEP-230]

C PLANE {0 0 0 1}

A PLANE {1 1 $\bar{2}$ 0}

FIG. 6B

R PLANE {1 $\bar{1}$ 0 2}

FIG. 6C

S PLANE {1 $\bar{1}$ 0 1}

METHOD FOR MANUFACTURING GAN SEMICONDUCTOR LIGHT-EMITTING ELEMENT

CROSS REFERENCES TO RELATED APPLICATIONS

The present application claims priority to Japanese Patent Application JP 2005-230415 filed in the Japanese Patent Office on Aug. 9, 2005, the entire contents of which are incorporated herein by reference.

BACKGROUND

The present invention generally relates to a method for manufacturing a GaN semiconductor light-emitting element.

In the process of manufacturing GaN semiconductor light-emitting elements, a GaN compound semiconductor layer is generally formed on the C plane of a sapphire substrate. In the GaN compound semiconductor layer epitaxially grown on the C plane of the sapphire substrate, its top face corresponds to the C plane and its side face corresponds to the A plane. That is, the top face of the GaN compound semiconductor layer is parallel to the {0001} plane of the GaN compound semiconductor crystal, and the side face of the GaN compound semiconductor layer is parallel to the $\{1\,1\,\bar{2}\,0\}$ plane of the GaN compound semiconductor crystal. Hereinafter, such a crystal plane is designated for convenience as the "{11-20} plane".

Furthermore, in this specification, in a hexagonal system, for example, the following crystal planes:

$\{h\,k\,\bar{i}\,l\}$ plane
$\{h\,\bar{k}\,i\,l\}$ plane are designated for convenience as the {hk-il} plane and {h-kil} plane, and the following directions:

$<h\,k\,\bar{i}\,l>$ direction
$<h\,\bar{k}\,i\,l>$ direction are designated for convenience as the <hk-il>direction and <h-kil>direction.

In the case of a light-emitting diode (LED) in which a first GaN compound semiconductor layer of a first conductivity type (e.g., n-type GaN layer), and an active layer composed of $In_xGa_{(1-x)}N$, and a second GaN compound semiconductor layer of a second conductivity type (e.g., p-type GaN layer) are stacked, the lattice constant of the $In_xGa_{(1-x)}N$ crystal is slightly larger than the lattice constant of the GaN crystal. In such a case, when the top face of each of the first GaN compound semiconductor layer, the active layer composed of $In_xGa_{(1-x)}N$, and the second GaN compound semiconductor layer stacked corresponds to the C plane, the active layer is subjected to compressive stress, and thus piezoelectric spontaneous polarization occurs in the thickness direction of the active layer. As a result, phenomena, such as a shift in wavelength of light emitted from such a light-emitting diode, a decrease in luminous efficiency, and an increase in operating voltage, and saturation in luminance, may occur.

On the other hand, when the top face of each of the first GaN compound semiconductor layer, the active layer composed of $In_xGa_{(1-x)}N$, and the second GaN compound semiconductor layer stacked corresponds to the A plane, the active layer is not subjected to compressive stress. Consequently, piezoelectric spontaneous polarization does not occur in the thickness direction of the active layer (for example, refer to Japanese Unexamined Patent Application Publication No. 2003-158294 (Patent Document 1)).

When an active layer composed of $In_xGa_{(1-x)}N$, the top face of which corresponds to the A plane, is formed by crystal growth, it is generally difficult to set the subscript x in the $In_xGa_{(1-x)}N$ composition at a desired value because the incorporation of In atoms into the active layer is low. That is, in the active layer whose top face corresponds to the C plane, since three nitrogen (N) atoms are capable of bonding to one gallium (Ga) atom present in the top face during crystal growth, there is a high probability that any of the three N atoms capable of bonding to one Ga atom will be replaced with an In atom. On the other hand, in an active layer whose top face corresponds to the A plane, since only two N atoms are capable of bonding to one Ga atom present in the top face during crystal growth, it is one of the two N atoms capable of bonding to one Ga atom that will be replaced with an In atom, and the probability of replacement with the In atom is low in comparison with the case of the active layer whose top face is the C plane. Thus, the incorporation of In atoms into the active layer is low. As a result, it is difficult to obtain a light-emitting diode which emits light at a desired wavelength.

SUMMARY

It is desirable to provide a method for manufacturing a GaN semiconductor light-emitting element in which a first GaN compound semiconductor layer, an active layer composed of $In_xGa_{(1-x)}N$, and a second GaN compound semiconductor layer are deposited, the top face of each of the layers corresponding to the A plane, and in which the subscript x in the $In_xGa_{(1-x)}N$ composition of the active layer can be reliably and stably set at a desired value.

According to an embodiment of the present invention, a method for manufacturing a GaN semiconductor light-emitting element includes the step of forming, by crystal growth, (A) a first GaN compound semiconductor layer of a first conductivity type, the top face of which corresponds to the A plane, (B) an active layer composed of $In_xGa_{(1-x)}N$, the top face of which corresponds to the A plane, and (C) a second GaN compound semiconductor layer of a second conductivity type, the top face of which corresponds to the A plane, in that order on a base which is a nonpolar plane, wherein the active layer is formed at a crystal growth rate of 0.3 nm/sec or more, and preferably at a crystal growth rate of 0.6 nm/sec or more.

In the method for manufacturing the GaN semiconductor light-emitting element according to the embodiment of the present invention, the upper limit of the growth rate of the active layer is determined from the viewpoint of whether the incorporation rate of In atoms into the active layer is high and moreover, whether high luminous efficiency can be maintained. The value x in $In_xGa_{(1-x)}N$ can also be increased by decreasing the crystal growth temperature of the active layer. In such a case, however, the luminous efficiency is decreased. Therefore, provided that both high luminous efficiency and the In composition (e.g., x is 0.15 to 0.25) for obtaining blue light emission and green light emission can be realized, the upper limit of the growth rate is specified. For example, the growth rate may be 0.64 nm/sec.

Figure 6A:
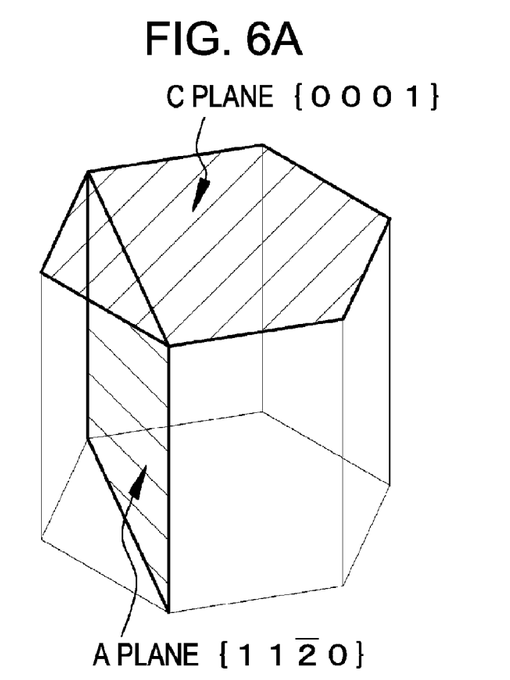
FIGS. 6A to 6C are schematic diagrams for describing the A plane, the C plane, the R plane, and the like in the hexagonal crystal.
Figure 6B:
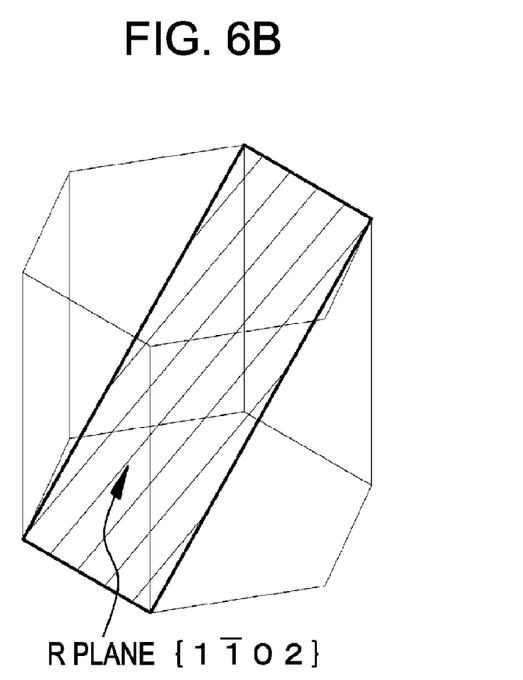
Figure 6C:
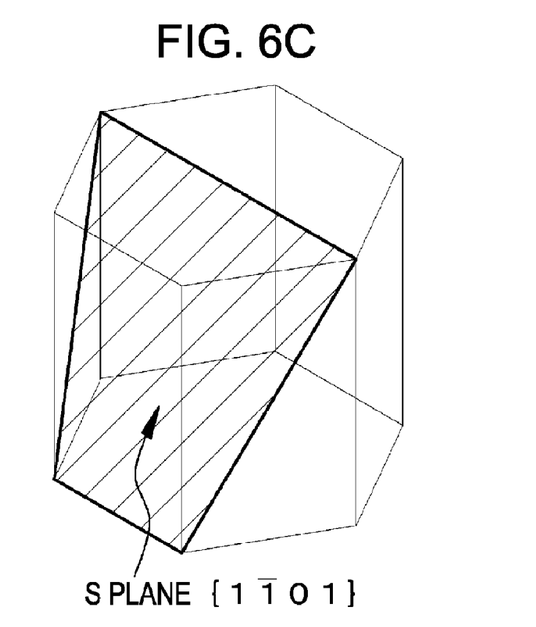

The A plane, C plane, R plane, and S plane in a hexagonal system are shown in FIGS. 6A to 6C. In this specification, the term "A plane" in "the top face corresponding to the A plane" includes a plane with an off-angle of plus/minus 5 degrees from the A plane.

A compound semiconductor is composed of cations (e.g., Ga) and anions (e.g., N). Ga is considered to be positive trivalent, and N is considered to be positive pentavalent or negative trivalent. A surface on which large or small amounts of Ga atoms and N atoms appear is referred to as a polar surface. For example, in the C+ plane, gallium (Ga) atom planes and nitrogen (N) atom planes alternately appear during growth. During this stage, directionality occurs vertically between cations with positive charges and anions with negative charges, which is referred to as "polarity". In contrast, for example, in the A plane, symmetry occurs in the arrangement of Ga atoms and N atoms, and localization of one type of atom or directionality does not occur, which is referred to as "nonpolarity". Such a plane is referred to as a "nonpolar plane". In the nonpolar plane, as in the A plane or the like, no symmetry occurs vertically between cation planes and anion planes. More specifically, in the present specification, examples of the nonpolar plane include the A plane which is the $\{11\text{-}20\}$ plane, the M plane which is the $\{1\text{-}100\}$ plane, and the $\{11\text{-}2n\}$ plane. Note that the $\{11\text{-}2n\}$ plane means a nonpolar plane at an angle of substantially 40 degrees (in the lateral direction) with respect to the C plane.

In the method for manufacturing the GaN semiconductor light-emitting element according to the embodiment of the present invention, for example, the relationship $0.05 \leq x \leq 0.3$ is satisfied. As the value x increases, the wavelength of light emitted from the GaN semiconductor light-emitting element increases. In the range of $0.05 \leq x \leq 0.3$, as the value x increases, the wavelength of light emitted from the GaN semiconductor light-emitting element changes, for example, from about 370 nm to about 560 nm. If the value x is less than 0.05, in some cases, the wavelength of light emitted from the GaN semiconductor light-emitting element may fall in the ultraviolet range. In the meantime, it is realistically difficult to obtain the $In_xGa_{(1-x)}N$ composition in which the value x exceeds 0.3 from the standpoint that luminous efficiency is improved.

In the method for manufacturing the GaN semiconductor light-emitting element according to the embodiment and preferred embodiments of the present invention, preferably, the first GaN compound semiconductor layer, the active layer, and the second GaN compound semiconductor layer are formed, by crystal growth, in sequence, using metal-organic chemical vapor deposition (MOCVD). When the active layer is formed, by crystal growth, using MOCVD, the feed rate per square centimeter of the base per minute of the In source gas is preferably set at $5 \times 10^{-7}$ mol·cm$^{-2}$·min$^{-1}$ or more and/or the feed rate per square centimeter of the base per minute of the Ga source gas is preferably set at $7 \times 10^{-7}$ mol·cm$^{-2}$·min$^{-1}$. The feed rate of the In source gas and the feed rate of the Ga source gas each are normalized on the basis of per square centimeter and per minute rate. By specifying the feed rate of the In source gas and the feed rate of the Ga source gas as described above, it is possible to more stably and more reliably set the composition (value x) in $In_xGa_{(1-x)}N$ constituting the active layer at the desired composition (value x). If the feed rate of the In source gas becomes excessively high, metallic In may be precipitated during the crystal growth of the active layer using MOCVD. If the feed rate of the Ga source gas becomes excessively high, metallic Ga may be precipitated during the crystal growth of the active layer using MOCVD. Furthermore, the temperature of the base during the crystal growth of the active layer using MOCVD is preferably set at 700° C. to 800° C., and more preferably 730° C. to 800° C. If the temperature of the base during the crystal growth of the active layer using MOCVD is less than 700° C., there may be cases in which the active layer of the GaN semiconductor light-emitting element does not emit light. If the temperature of the base during the crystal growth of the active layer using MOCVD is increased, it is possible to improve the crystallinity of the active layer. However, if the temperature exceeds 800° C., there is a tendency that the value x in $In_xGa_{(1-x)}N$ constituting the active layer decreases, resulting in a decrease in the wavelength of light emitted from the GaN semiconductor light-emitting element. If possible, it is desirable to specify the growth temperature of the active layer during the crystal growth of the active layer using MOCVD. However, since there is a difficulty in measuring the temperature of the active layer under crystal growth, the temperature of the base during the crystal growth of the active layer using MOCVD is specified. The growth temperature of the active layer during the crystal growth of the active layer using MOCVD can be assumed to be equivalent to the temperature of the base during the crystal growth of the active layer using MOCVD.

In the method for manufacturing the GaN semiconductor light-emitting element according to the embodiment and preferred embodiments of the present invention described above, the base may be composed of an underlying layer formed of a GaN compound semiconductor, the top face of the underlying layer corresponding to the A plane, the underlying layer being formed on a substrate. In such a case, the manufacturing method may further include the steps of (a) discretely forming a plurality of strip-shaped seed layers composed of a GaN compound semiconductor so that the seed layers extend in the X direction on the R plane of a sapphire substrate, (b) performing lateral epitaxial growth of a first underlying layer composed of a GaN compound semiconductor in the Y direction from each seed layer, the top face of the first underlying layer corresponding to the A plane, (c) forming a mask layer on the top face of the first underlying layer in a region located above each seed layer, and then (d) performing lateral epitaxial growth of a second underlying layer composed of a GaN compound semiconductor in the Y direction from the top face of the first underlying layer in the Y direction over the top face of the first underlying layer and the mask layer, the top face of the second underlying layer corresponding to the A plane, wherein the second underlying layer corresponds to the underlying layer. Such a method is referred to as a method for manufacturing a GaN semiconductor light-emitting element according to a first structure of the embodiment of the present invention. Depending on the case, formation of the mask layer may not be necessary.

Preferably, the lateral epitaxial growth is performed by MOCVD in which an organogallium source gas and a nitrogen source gas (e.g., ammonia gas) are employed. The lateral epitaxial growth means an epitaxial lateral overgrowth (ELOG) technique.

In the method for manufacturing the GaN semiconductor light-emitting element according to the first structure of the embodiment of the present invention, preferably, although not limited thereto, the first underlying layer is allowed to epitaxially grow laterally in the Y direction from each seed layer and the lateral epitaxial growth is stopped before facing side faces of the two adjacent first underlying layers come into contact with each other, the second underlying layers are allowed to epitaxially grow laterally in the Y direction, and also GaN compound semiconductor layers (which have the same composition as that of the second underlying layers and are referred to for convenience as "third underlying layers") are allowed to epitaxially grow laterally in the Y direction from the facing side faces of the two adjacent first underlying layers. Preferably, the relationship $0.5 \leq L/P_s \leq 0.99$ is satisfied, and more preferably, the relationship $0.6 \leq L/P_s \leq 0.8$ is satisfied, where L is the distance between the facing side faces of the two adjacent first underlying layers and $P_s$ is the pitch of the seed layers, from the standpoint that the number of defects is decreased or that the underlying layers are prevented from being detached from the sapphire substrate.

In the lateral epitaxial growth of the first underlying layer composed of the GaN compound semiconductor by means of MOCVD, the feed molar ratio of the nitrogen source gas (e.g., ammonia gas) to the organogallium source gas, i.e., V/III ratio, is preferably set at $1 \times 10$ to $3 \times 10^3$, and more preferably $1 \times 10^2$ to $1 \times 10^3$. Alternatively, in the lateral epitaxial growth of the first underlying layer by means of MOCVD, the number of moles of the organogallium source gas fed per square centimeter of the sapphire substrate per minute is preferably set at $0.5 \times 10^{-6}$ mol·cm$^{-2}$·min$^{-1}$ to $5 \times 10^{-6}$ mol·cm$^{-2}$·min$^{-1}$, and more preferably $0.5 \times 10^{-6}$ mol·cm$^{-2}$·min$^{-1}$ to $2 \times 10^{-6}$ mol·cm$^{-2}$·min$^{-1}$. Alternatively, in the lateral epitaxial growth of the first underlying layer by means of MOCVD, the total pressure of gases including the nitrogen source gas is preferably set at $1 \times 10^3$ Pa to $3 \times 10^4$ Pa, and more preferably $1 \times 10^3$ Pa to $1 \times 10^4$ Pa. By setting the V/III ratio, the number of moles of the organogallium source gas fed, or the total pressure of gases including the nitrogen source gas in the range described above, the lateral epitaxial growth of the first underlying layer can be performed reliably and stably. Note that the total pressure of gases including the nitrogen source gas means the pressure (including the pressures of hydrogen gas, ammonia gas, and the like in addition to the nitrogen gas) in a MOCVD system. Hereinafter, the "total pressure of gases including the nitrogen source gas" is also used in the same meaning.

In the lateral epitaxial growth of the second underlying layer (and the third underlying layer) by means of MOCVD, the feed molar ratio of the nitrogen source gas (e.g., ammonia gas) to the organogallium source gas, i.e., V/III ratio, is preferably set at $1 \times 10$ to $3 \times 10^3$, and more preferably $1 \times 10^2$ to $1 \times 10^3$. Alternatively, in the lateral epitaxial growth of the second underlying layer (and the third underlying layer) by means of MOCVD, the number of moles of the organogallium source gas fed per square centimeter of the sapphire substrate per minute is preferably set at $0.5 \times 10^{-6}$ mol·cm$^{-2}$·min$^{-1}$ to $5 \times 10^{-6}$ mol·cm$^{-2}$·min$^{-1}$, and more preferably $0.5 \times 10^{-6}$ mol·cm$^{-2}$·min$^{-1}$ to $2 \times 10^{-6}$ mol·cm$^{-2}$·min$^{-1}$. Alternatively, in the lateral epitaxial growth of the second underlying layer (and the third underlying layer) by means of MOCVD, the total pressure of gases including the nitrogen source gas is preferably set at $1 \times 10^3$ Pa to $3 \times 10^4$ Pa, and more preferably $1 \times 10^3$ Pa to $1 \times 10^4$ Pa. By setting the V/III ratio, the number of moles of the organogallium source gas fed, or the total pressure of gases including the nitrogen source gas in the range described above, the lateral epitaxial growth of the second underlying layer and the third underlying layer can be performed reliably and stably.

Preferably, the X direction in which the strip-shaped seed layers extend is parallel to the <1-100> direction.

The strip-shaped seed layers composed of the GaN compound semiconductor can be obtained by forming a GaN compound semiconductor layer (e.g., a GaN layer whose top face corresponds to the A plane) on the R plane of a sapphire substrate, and then patterning the GaN compound semiconductor layer by lithography and etching. Alternatively, the strip-shaped seed layers composed of the GaN compound semiconductor can be obtained by forming a GaN compound semiconductor layer (e.g., a GaN layer whose top face corresponds to the A plane) on the R plane of a sapphire substrate, forming a non-growing layer (i.e., a layer on which crystal growth of a GaN compound semiconductor layer does not occur) thereon, and then patterning the non-growing layer by lithography and etching to expose the GaN compound semiconductor layer in the shape of strips. The material constituting the non-growing layer may be appropriately selected from the group of materials used for the mask layer, which will be described below. Examples of the method for forming the GaN compound semiconductor layer constituting the seed layer include MOCVD, molecular beam epitaxy (MBE), and hydride vapor deposition in which a halogen contributes to transportation or reaction).

Preferably, the planar shape of the mask layer is strip-like. In such a case, preferably, the projection of the seed layer is parallel to the projection of the mask layer. Preferably, the projection of the seed layer is contained in the projection of the mask layer. Furthermore, preferably, the relationship $1 < W_M/W_S$ is satisfied, and more preferably, the relationship $1 < W_M/W_S \leq 2$ is satisfied, where $W_S$ is the width of the seed layer, and $W_M$ is the width of the mask layer. Furthermore, preferably, the relationship $0.01 \leq W_S/P_S \leq 0.5$ is satisfied, and more preferably, the relationship $0.1 \leq W_S/P_S \leq 0.3$ is satisfied, where $P_S$ is the pitch of the seed layers. If the relationship $1 < W_M/W_S$ is satisfied, the crystal defect density in the resulting second underlying layer can be reliably decreased.

The crystal growth of the second underlying layer composed of the GaN compound semiconductor does not occur on the mask layer. The crystal growth of the second underlying layer starts on the top face of the first underlying layer, and the second underlying layer extends over the mask layer. Specific examples of the mask layer include high-melting-point metal layers, such as a silicon oxide layer (SiO$_x$ layer), a silicon nitride layer (SiN$_y$ layer), a Ta$_2$O$_5$ layer, a ZrO$_2$ layer, an AlN layer, an Al$_2$O$_3$ layer, and a laminate of two or more of these layers (e.g., a structure in which a silicon oxide layer and a silicon nitride layer are deposited from the bottom), an Ni layer, and a tungsten layer. The mask layer can be formed by chemical vapor deposition (CVD) or physical vapor deposition (PVD), such as vacuum deposition or sputtering.

In the method for manufacturing the GaN semiconductor light-emitting element according to the embodiment and preferred embodiments of the present invention, the base may be composed of a GaN substrate whose top face corresponds to the A plane. Such a method is referred to as a method for manufacturing a GaN semiconductor light-emitting element according to a second structure of the embodiment of the present invention. Such a structure can be obtained by polishing a GaN substrate using a chemical-mechanical polishing (CMP) technique, or by cutting a GaN substrate with a dicer.

In the method for manufacturing the GaN semiconductor light-emitting element according to the embodiment and preferred embodiments of the present invention, after the second GaN compound semiconductor layer is formed, preferably, a second electrode is formed on the second GaN compound semiconductor layer.

In the method for manufacturing the GaN semiconductor light-emitting element according to the first structure of the embodiment of the present invention, preferably, the second electrode is formed above the second underlying layer disposed on the top face of the first underlying layer. More preferably, the projection of the second electrode is contained in the projection of the second underlying layer disposed on the top face of the first underlying layer. In such a case, preferably, the relationship $1 < W_M/W_S$ is satisfied, and more preferably, the relationship $1 < W_M/W_S \leq 2$ is satisfied; and preferably, the relationship $W_{E2}/(P_S - W_M) < 1$ is satisfied, and more preferably, the relationship $W_{E2}/(P_S - W_M) < 0.5$ is satisfied, where the planar shape of the seed layer is strip-like with a width $W_S$, the planar shape of the mask layer is strip-like with a width $W_M$, $P_s$ is the pitch of the seed layers, and $W_{E2}$ is the width of the second electrode. If the relationship $1 < W_M/$ $W_S$ is satisfied, the crystal defect density in the resulting second underlying layer can be reliably decreased. If the relationship $W_{E2}/(P_S-W_M)<1$ is satisfied, it is possible to dispose the second electrode on the second GaN compound semiconductor layer of the second conductivity type in which the crystal defect density is further decreased.

In the method for manufacturing the GaN semiconductor light-emitting element according to the first structure of the embodiment of the present invention, after the second GaN compound semiconductor layer is formed, preferably, the seed layer and the first underlying layer (and the third underlying layer) are detached from the R plane of the sapphire substrate. Furthermore, after the seed layer and the first underlying layer (and the third underlying layer) are detached from the R plane of the sapphire substrate, preferably, the seed layer, the first underlying layer (and the third underlying layer), the second underlying layer (and the mask layer) are removed to expose the first GaN compound semiconductor layer. More preferably, a first electrode is formed on the exposed first GaN compound semiconductor layer. One example of the method for detaching the seed layer and the first underlying layer from the R plane of the sapphire substrate is a method in which the interface between the sapphire substrate and each of the seed layer and the first underlying layer is irradiated, through the sapphire substrate, with laser light (e.g., KrF excimer laser light with a wavelength of 248 nm). Furthermore, examples of the method for removing the seed layer, the first underlying layer, etc. include a method of etching the seed layer, the first underlying layer, etc., a polishing method, and a combination of etching and polishing. On the other hand, in the method for manufacturing the GaN semiconductor light-emitting element according to the second structure of the embodiment of the present invention, a first electrode may be formed on the reverse face of the GaN substrate whose top face is the A plane.

In the method for manufacturing the GaN semiconductor light-emitting element according to the embodiment and preferred embodiments and structures of the present invention, when the second conductivity type is p type, preferably, the second electrode has a single-layer structure or a multilayer structure including at least one metal selected from the group consisting of palladium (Pd), platinum (Pt), nickel (Ni), aluminum (Al), titanium (Ti), gold (Au), and silver (Ag). Alternatively, a transparent conductive material, such as indium tin oxide (ITO) may be used. Among these, use of silver (Ag) capable of reflecting light with high efficiency is preferred. On the other hand, when the first conductivity type is n type, preferably, the first electrode has a single-layer structure or a multilayer structure including at least one metal selected from the group consisting of gold (Au), silver (Ag), palladium (Pd), aluminum (Al), titanium (Ti), tungsten (W), copper (Cu), zinc (Zn), tin (Sn), and indium (In). Examples thereof include Ti/Au, Ti/Al, and Ti/Pt/Au. The first electrode and the second electrode may be formed by PVD, such as vacuum deposition or sputtering.

In the method for manufacturing the GaN semiconductor light-emitting element according to the embodiment and preferred embodiments and structures of the present invention, as each of the first GaN compound semiconductor layer of the first conductivity type, the second GaN compound semiconductor layer of the second conductivity type, the seed layer, the first underlying layer, the second underlying layer, and the third underlying layer, for example, a GaN layer, an AlGaN layer, an InGaN layer, an AlInGaN layer, or a GaN compound semiconductor layer obtained by incorporating boron (B) atoms or thallium (Tl) atoms into any of these compound semiconductor layers may be used. Furthermore, the active layer may contain aluminum (Al) atoms, boron (B) atoms, or thallium (Tl) atoms. The active layer may be a single $In_xGa_{(1-x)}N$ layer or may have a single quantum well (QW) structure or a multiple quantum well (MQW) structure.

In MOCVD, as the organogallium source gas, trimethylgallium (TMG) gas or triethylgallium (TEG) gas may be used, and as the nitrogen source gas, ammonia gas or hydrazine gas may be used. Furthermore, examples of the combination of the first conductivity type and the second conductivity type include a combination of n type and p type and a combination of p type and n type. In the formation of an n-type GaN compound semiconductor layer, for example, silicon (Si) may be added as an n-type impurity. In the formation of a p-type GaN compound semiconductor layer, for example, magnesium (Mg) may be added as a p-type impurity. Furthermore, when the GaN compound semiconductor layer includes aluminum (Al) or indium (In) as a constituent atom, trimethylaluminum (TMA) gas may be used as an Al source and trimethylindium (TMI) gas may be used as an In source. Furthermore, monosilane gas ($SiH_4$ gas) may be used as an Si source, and cyclopentadienylmagnesium gas or methylcyclopentadienylmagnesium may be used as an Mg source. Furthermore, in addition to Si, examples of the n-type impurity include Ge, Se, Sn, C, and Ti. In addition to Mg, examples of the p-type impurity include Zn, Cd, Be, Ca, Ba, and O.

Examples of the light-emitting element obtained by the method for manufacturing the GaN semiconductor light-emitting element according to the embodiment of the present invention include light-emitting diodes (LEDs) and semiconductor lasers or laser diodes (LDs). As long as the laminate structure including GaN compound semiconductor layers is a light-emitting diode structure or a laser structure, except for the active layer, the type and structure of the GaN compound semiconductor are not particularly limited, and the type and structure of the GaN compound semiconductor layer are also not particularly limited.

In the method for manufacturing the GaN semiconductor light-emitting element according to the embodiment of the present invention, by setting the crystal growth rate of the active layer at 0.3 nm/sec or more, which is significantly faster than the crystal growth rate of the known active layer, it is possible to stably and reliably control the value x in $In_xGa_{(1-x)}N$ constituting the active layer, and thus a light-emitting diode capable of emitting light at a desired wavelength can be provided.

Moreover, in each of the first GaN compound semiconductor layer, the active layer, and the second GaN compound semiconductor layer formed by the method for manufacturing the GaN semiconductor light-emitting element according to the embodiment of the present invention, the top face corresponds to the A plane, and the side face (e.g., the C plane) is perpendicular to the interface with the active layer. Consequently, even if piezoelectric spontaneous polarization occurs in the active layer, the piezoelectric spontaneous polarization occurs in a direction at a right angle to the thickness direction of the active layer. Therefore, it is possible to prevent the occurrence of phenomena, such as a shift in luminescence wavelength, a decrease in luminous efficiency due to the quantum-confined Stark effect (QCSE), an increase in operating voltage, and saturation in luminance.

Additional features and advantages are described herein, and will be apparent from, the following Detailed Description and the figures.

DETAILED DESCRIPTION

A description based on examples illustrative of an embodiment with reference to the drawings is provided below.

EXAMPLE 1

Example 1 relates to a method for manufacturing a GaN semiconductor light-emitting element. The method for manufacturing the GaN semiconductor light-emitting element in Example 1 will be described below with reference to FIGS. 1A to 1D, which are each a schematic end elevation of a sapphire substrate, etc. Hereinafter, in some cases, description may be made on the basis of the gas flow rate (unit: SLM). Note that the number of moles of gas fed (unit: $10^{-6}$ mol·cm$^{-2}$·min$^{-1}$) can be obtained by multiplying the gas flow rate by a coefficient. Here, a gas flow rate of 1 SLM is equal to $4.5 \times 10^{-2}$ mol·min$^{-1}$, and the coefficient can be obtained by dividing this value by an equivalent area (i.e., substantial area of the base) S. In Example 1, the equivalent area S is 42 cm$^2$.

[Step-100]

Figure 1A:
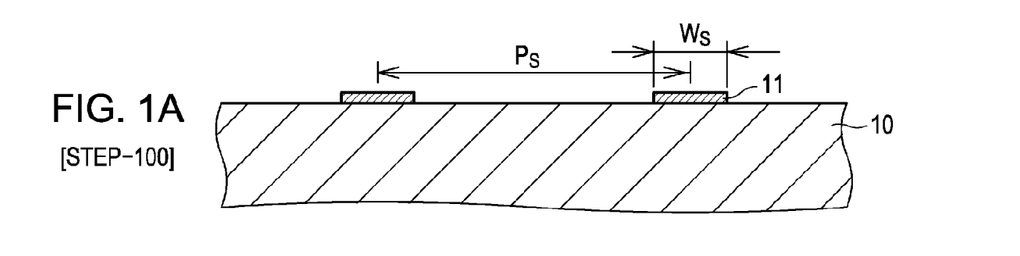
FIGS. 1A to 1D are each a schematic end elevation of a sapphire substrate, etc. for describing a process for manufacturing a GaN semiconductor light-emitting element in Example 1.

First, a plurality of strip-shaped seed layers 11 composed of a GaN compound semiconductor (specifically, GaN) are formed discretely on the R plane of a sapphire substrate 10 so as to extend in the X direction (refer to FIG. 1A). The R plane of the sapphire substrate 10 corresponds to the {1-102} plane. Specifically, the sapphire substrate 10 is placed into an MOCVD system, and the surface of the sapphire substrate 10 is subjected to thermal cleaning. Then, a planar GaN compound semiconductor layer with a thickness of about 2 μm is formed by crystal growth on the R plane of the sapphire substrate 10 by means of MOCVD using trimethylgallium (TMG) gas as an organogallium source gas and ammonia (NH$_3$) gas as a nitrogen source gas under the crystal growth conditions that a mirror surface is formed by appropriately selecting the V/III ratio, i.e., the feed molar ratio of the nitrogen source gas to the organogallium source gas, so as to minimize the occurrence of pits and the like. Specifically, a GaN layer whose top face corresponds to the A plane is subjected to crystal growth on the R plane of the sapphire substrate 10. However, high-density defects, such as stacking faults are present in the GaN compound semiconductor layer. Subsequently, the sapphire substrate 10 is taken out of the MOCVD system, and the GaN compound semiconductor layer is subjected to patterning using lithography and reactive ion etching (RIE) so that strip shapes are formed in plan view. Thus, a plurality of strip-shaped seed layers 11 discretely extending in the X direction can be formed. Here, the X direction in which the seed layers 11 extend is parallel to the <1-100>direction. The thickness $W_S$ of the planar shape of the strip-shaped seed layer 11 is 10 μm, and the pitch $P_S$ of the seed layers is 40 μm.

[Step-110]

Figure 1B:
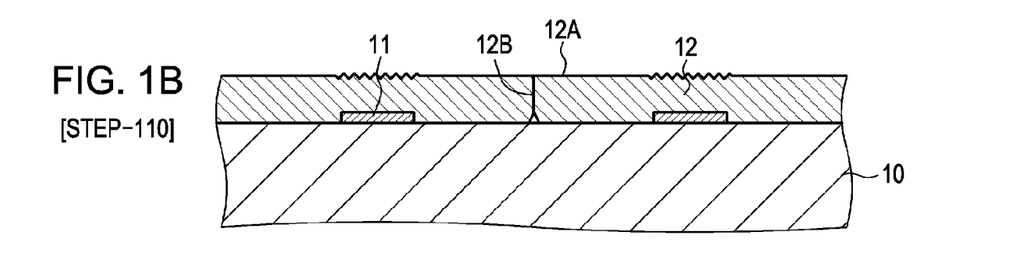

Subsequently, lateral epitaxial growth of a first underlying layer 12 is performed from the top face of each seed layer 11 in the Y direction, a top face 12A of the first underlying layer 12 corresponding to the A plane, a side face 12B of the first underlying layer 12 corresponding to the C plane (refer to FIG. 1B). In Example 1, the lateral epitaxial growth is stopped when facing side faces 12B of the two adjacent first underlying layers 12 come into contact with each other. Specifically, the sapphire substrate 10 is placed into the MOCVD system again, a first underlying layer 12 composed of a GaN compound semiconductor (specifically, GaN) is subjected to lateral epitaxial growth from the top face of each seed layer 11 in the Y direction, the top face 12A corresponding to the A plane, the side face 12B corresponding to the C plane, by means of MOCVD using triethylgallium (TEG) gas as an organogallium source gas and ammonia (NH$_3$) gas as a nitrogen source gas.

Table 1 below shows an example of the crystal growth conditions.

TABLE 1

| | |
|---|---|
| V/III ratio | About 500 |
| Feed rate of organogallium source gas | $4.5 \times 10^{-6}$ mol·cm$^{-2}$·min$^{-1}$ |
| Feed rate of nitrogen source gas (NH$_3$) | 1 SLM |
| Net growth rate | 12 μm/hr |
| Pressure of nitrogen source gas | $1 \times 10^4$ Pa |

Additionally, when the pressure of the nitrogen source gas was set at $9 \times 10^4$ Pa, the top face of the first underlying layer 12 turned out to be the S plane, i.e., {1-101} plane.

[Step-120]

Figure 1C:
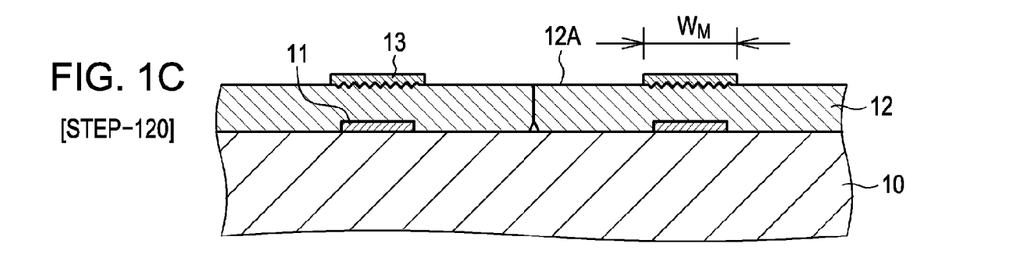

Subsequently, the sapphire substrate 10 is taken out of the MOCVD system, and a mask layer 13 is formed on the top face 12A of a portion of the first underlying layer 12 located above each seed layer 11 (refer to FIG. 1C). The mask layer 13 has a laminate structure in which a silicon oxide layer and a silicon nitride layer are deposited from the bottom, and can be formed using plasma CVD, lithography, and wet etching. The width $W_M$ of the mask layer 13 whose planar shape is strip-like is 16 μm. That is, the projection of the seed layer 11 is contained in the projection of the mask layer 13, and $W_M/W_S=1.6$.

The projection of the seed layer 11 is parallel to the projection of the mask layer 13. The centerline of the mask layer 13 may be located directly above the centerline of the seed layer 11. Alternatively, the centerline of the mask layer 13 may be located at a position other than that directly above the centerline of the seed layer 11. That is, depending on the crystal growth conditions for the first underlying layer 12, in some cases, crystal defects in the portion of the first underlying layer 12 located above the seed layer 11 may occur in larger quantities in the <0001>direction or in the <000-1>direction of the first underlying layer 12 compared with the centerline of the seed layer 11. In such cases, in the formation of the mask layer 13, the centerline of the mask layer 13 is allowed to be located at the position other than that directly above the centerline of the seed layer 11 so that the mask layer 13 covers as many crystal defects as possible in the portion of the first underlying layer 12 located above the seed layer 11.

Furthermore, when it is difficult to identify the crystal defects in the portion of the first underlying layer 12 located above the seed layer 11, if another first underlying layer 12 is further subjected to crystal growth at a thickness of about 1 μm under the crystal growth conditions exemplified in Table 2 below, pits are likely to occur in the crystal defect portions in the first underlying layer 12. Thus, the crystal defects can be easily identified.

TABLE 2

| | |
|---|---|
| V/III ratio | About 8,000 |
| Feed rate of nitrogen source gas | 6 SLM |
| Lateral growth rate | 4 μm/hr |
| Pressure of nitrogen source gas | $9 \times 10^4$ Pa |

[Step-130]

Figure 1D:
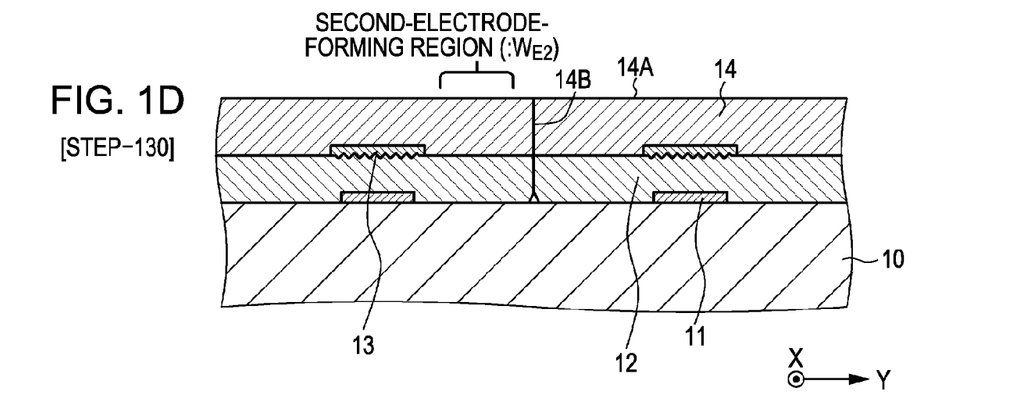

Subsequently, lateral epitaxial growth of a second underlying layer 14 is performed from the top face 12A of the first underlying layer 12 in the Y direction over the top face 12A of the first underlying layer 12 and the mask layer 13 (refer to FIG. 1D). Specifically, the sapphire substrate 10 is placed into the MOCVD system again, a second underlying layer 14 composed of a GaN compound semiconductor (specifically, GaN) is subjected to lateral epitaxial growth from the top face 12A of the first underlying layer 12 in the Y direction, the top face 14A of the second underlying layer 14 corresponding to the A plane, the side face 14B of the second underlying layer 14 corresponding to the C plane, by means of MOCVD using triethylgallium (TEG) gas as an organogallium source gas and ammonia gas as a nitrogen source gas. The crystal growth conditions may be the same as those shown in Table 1.

In such a manner, the base which is the nonpolar plane and which is composed of the second underlying layer 14 can be obtained.

[Step-140]

Subsequently, in the same MOCVD system, without decreasing the temperature of the sapphire substrate 10, a first GaN compound semiconductor layer of a first conductivity type (specifically, n type), the top face of which corresponds to the A plane, (specifically, for example, a GaN layer doped with Si with a thickness of about 1 μm), an active layer composed of $In_xGa_{(1-x)}N$, the top face of which corresponds to the A plane (specifically, for example, having a multiple quantum well (MQW) structure including $In_xGa_{(1-x)}N$ layers with a thickness of 2.5 nm/barrier layers composed of GaN with a thickness of 7.5 nm, the number of $In_xGa_{(1-x)}N$ layers being five), and a second GaN compound semiconductor layer of a second conductivity type (specifically, p type), the top face of which corresponds to the A plane, (specifically, for example, an AlGaN layer doped with Mg with a thickness of 5 to 20 nm and a GaN layer doped with Mg with a thickness of 100 nm) are formed, by crystal growth, in that order on the second underlying layer 14 by means of MOCVD. Preferably, the first GaN compound semiconductor layer is subjected to crystal growth under the crystal growth conditions shown in Table 3 below in which the number of crystal defects is decreased. The crystal growth conditions for the $In_xGa_{(1-x)}N$ layer constituting the active layer are shown in Table 4. For testing, the following five growth rates for the $In_xGa_{(1-x)}N$ layer are set:

Condition-1: 0.04 nm/sec
Condition-2: 0.16 nm/sec
Condition-3: 0.32 nm/sec
Condition-4: 0.64 nm/sec
Condition-5: 1.28 nm/sec

TABLE 3

| | |
|---|---|
| V/III ratio | 1,000 or more |
| Pressure of nitrogen source gas | $5 \times 10^4$ Pa or more |

TABLE 4

| | | Source gas feed rate in MOCVD | | | | |
|---|---|---|---|---|---|---|
| | Unit | Condition-1 | Condition-2 | Condition-3 | Condition-4 | Condition-5 |
| TEG | $10^{-6}$ mol · cm$^{-2}$ · min$^{-1}$ | 0.12 | 0.48 | 0.96 | 1.9 | 3.8 |
| TMI | $10^{-6}$ mol · cm$^{-2}$ · min$^{-1}$ | 0.7 | 0.7 | 0.7 | 0.7 | 0.7 |
| Nitrogen source gas (NH$_3$ gas) | SLM | 7.5 | 7.5 | 7.5 | 7.5 | 7.5 |
| Pressure in growth atmosphere | $\times 10^3$ Pa | 90 | 90 | 90 | 90 | 90 |
| Temperature of base | °C. | 710 | 710 | 710 | 710 | 710 |
| Growth rate of $In_xGa_{(1-x)}N$ layer | nm/sec | 0.04 | 0.16 | 0.32 | 0.64 | 1.28 |
| Value x | | 0 | 0.07 | 0.16 | 0.21 | 0.21 |
| Luminescence wavelength | nm | 360 | 400 | 450 | 480 | 480 |

[Step-150]

Subsequently, a second electrode is formed on the second GaN compound semiconductor layer of a second conductivity type (specifically, p type). The second electrode has a laminate structure of Ni layer/Ag layer/Au layer and can be formed by vacuum deposition. The second electrode is formed above the second underlying layer 14 disposed on the top face 12A of the first underlying layer 12. The projection of the second electrode is contained in the projection of the second underlying layer 14 disposed on the top face 12A of the first underlying layer 12. The planar shape of the second electrode can be strip-like, circular, elliptical, or the like. The width $W_{E2}$ of the second electrode (the width in the same direction as that of the mask layer 13) is 14 μm. Preferably, the second electrode is not formed above the second underlying layer 14 located above the mask layer 13. More preferably, the second electrode is formed so as not to stride over the joint between the two adjacent second underlying layers 14.

[Step-160]

Subsequently, a supporting layer is formed over the entire surface or a support is bonded to the entire surface, and then the seed layers 11 and the first underlying layers 12 are detached from the R plane of the sapphire substrate 10. Specifically, a laser beam (e.g., KrF excimer laser beam with a wavelength of 248 nm) is applied to the interface between the sapphire substrate 10 and each of the seed layers 11 and the first underlying layers 12 through the sapphire substrate 10. Subsequently, the seed layers 11, the first underlying layers 12, the mask layers 13, and the second underlying layers 14 are removed by a method in which etching and polishing are combined to expose the first GaN compound semiconductor layer. A first electrode is formed on the exposed first GaN compound semiconductor layer. The first electrode has a laminate structure of Ti layer/Au layer. Furthermore, a transparent electrode composed of ITO connected to the first electrode is formed.

[Step-170]

Subsequently, a laminate structure including the first GaN compound semiconductor layer, the active layer, and the second GaN compound semiconductor layer is cleaved and cut to form an LED chip. Mounting is performed such that the transparent electrode is positioned at the top, and wiring and resin molding are performed. Thus, a GaN semiconductor light-emitting element composed of a shell-shaped LED can be obtained.

The operating voltage of the resulting GaN semiconductor light-emitting element was 2.8 V, which was very low, at a current density of about 50 A/cm$^2$.

Figure 2A:
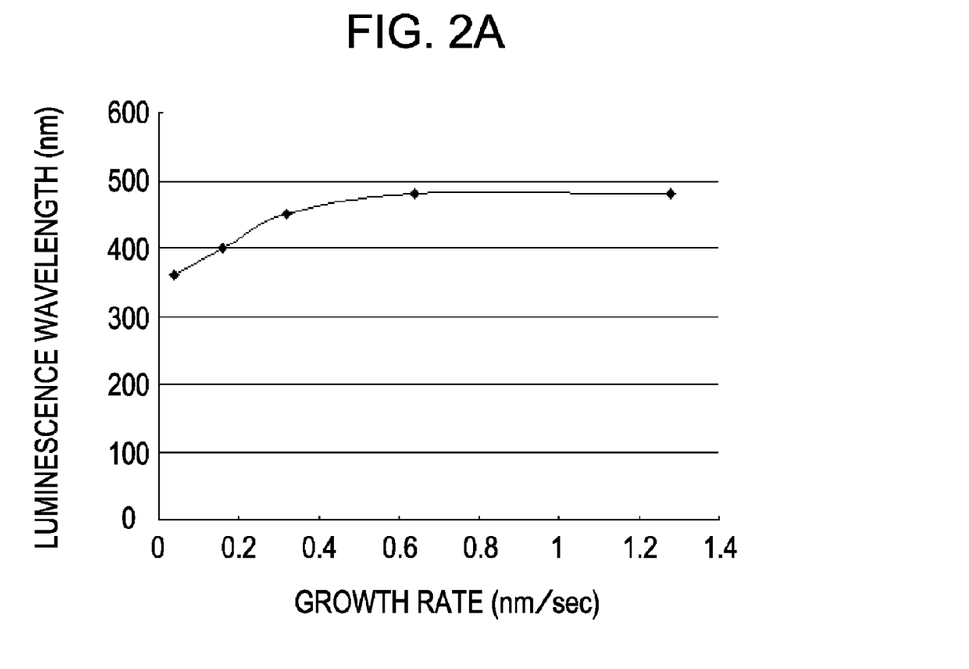
FIG. 2A is a graph showing the relationship between the growth rate of $In_xGa_{(1-x)}N$ layers constituting active layers and the luminescence wavelength in the resulting GaN semiconductor light-emitting elements.
Figure 2B:
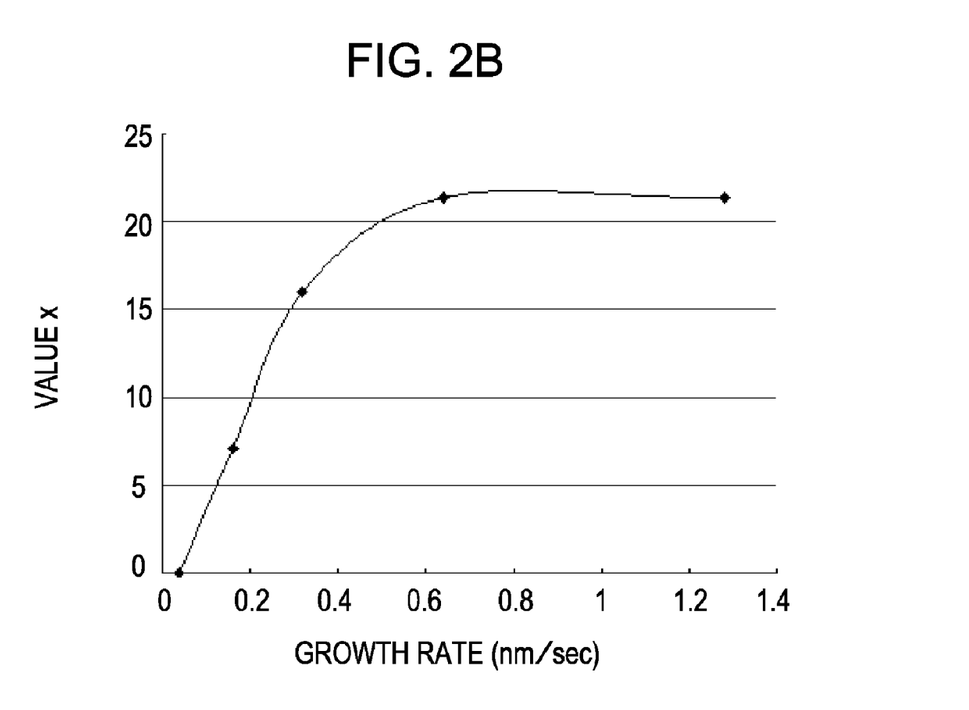
FIG. 2B is a graph showing the relationship between the growth rate and the value x of $In_xGa_{(1-x)}N$ layers constituting active layers.

The relationship between the growth rate of the In$_x$Ga$_{(1-x)}$N layer constituting the active layer and the luminescence wavelength of the resulting GaN semiconductor light-emitting element (LED) and the relationship between the growth rate and the value x are shown in Table 4 and in the graphs of FIGS. 2A and 2B. When the temperature of the base is 710° C., the value x in the In$_x$Ga$_{(1-x)}$N layer constituting the active layer is substantially stabilized at a growth rate of the In$_x$Ga$_{(1-x)}$N layer of 0.3 nm/sec or more, and preferably 0.6 nm/sec or more.

Figure 3A:
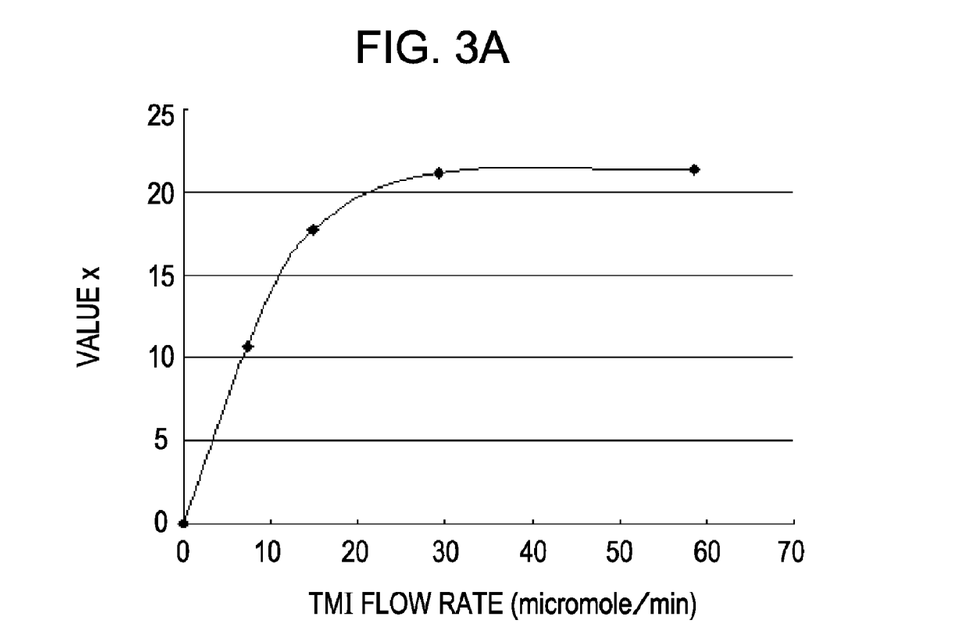
FIG. 3A is a graph showing the relationship between the value x in $In_xGa_{(1-x)}N$ and the flow rate of TMI gas when the TMI gas feed rate is changed from 0 to $60 \times 10^{-6}$ mol·min$^{-1}$ ($1.4 \times 10^{-6}$ mol·cm$^{-2}$·min$^{-1}$) during crystal growth of the $In_xGa_{(1-x)}N$ layer constituting the active layer in Step-140 in the method for manufacturing the GaN semiconductor light-emitting element in Example 1 according to the embodiment of the present invention.

FIG. 3A shows the change in the value x in the In$_x$Ga$_{(1-x)}$N layer constituting the active layer when the feed rate of trimethylindium (TMI) gas is changed from 0 to 60×10$^{-6}$ mol·min$^{-1}$ (1.4×10$^{-6}$ mol·cm$^{-2}$·min$^{-1}$) during crystal growth of the In$_x$Ga$_{(1-x)}$N layer in Step-140. The other conditions in crystal growth is shown in Table 5 under "Condition-A". In FIG. 3A, the unit for the value on the axis of abscissas is "×10$^{-6}$ mol·min$^{-1}$", and if this value is divided by "42 cm$^2$", the feed rate per square centimeter of the base per minute (normalized feed rate) of In source gas can be obtained. As is evident from FIG. 3A, when the flow rate per minute of In source gas is 20×10$^{-6}$ mol·min$^{-1}$ or higher, i.e., the feed rate per square centimeter of the base per minute of In source gas is 5×10$^{-7}$ mol·cm$^{-2}$·min$^{-1}$ or higher, the value x in the In$_x$Ga$_{(1-x)}$N layer is substantially stabilized.

Figure 3B:
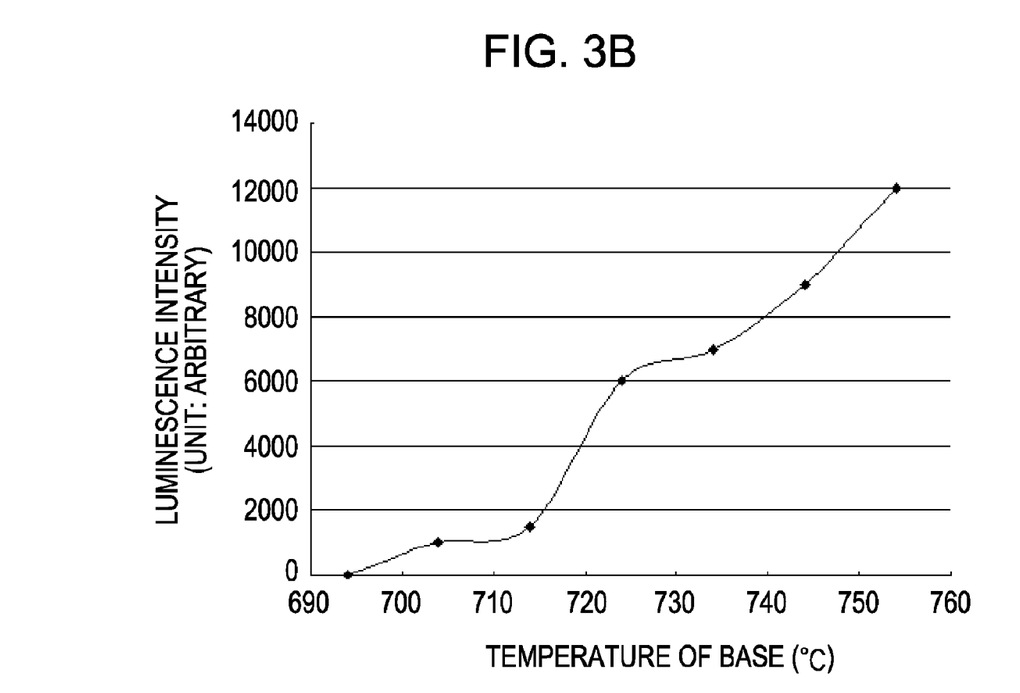
FIG. 3B is a graph showing the relationship between the temperature of the base and the luminescence intensity when the active layer is subjected to crystal growth.

Furthermore, the relationship between the luminescence intensity and the temperature of the base during crystal growth of the active layer was examined. The luminous efficiency was evaluated by measuring the luminescence intensity (photoluminescence intensity) when the In$_x$Ga$_{(1-x)}$N layer constituting the active layer was directly excited with a Kr laser. The crystal growth conditions for the In$_x$Ga$_{(1-x)}$N layer constituting the active layer of the test piece used for the evaluation are the same as those shown under "Condition-A" in Table 5, and the relationship between the temperature of the base and the luminescence intensity measured is shown in FIG. 3B. As is evident from FIG. 3B, as the temperature of the base increases, luminescence intensity increases. At a temperature of the base of less than 700° C., the active layer of the GaN semiconductor light-emitting element does not emit light, and as the temperature of the base increases, luminous efficiency increases.

TABLE 5

|  | Unit | Condition-A |
| --- | --- | --- |
| Source gas feed rate in MOCVD | | |
| TEG | μmol/min | 81 |
| TMI | μmol/min | 60 |
| Nitrogen source gas (NH$_3$ gas) | SLM | 7.5 |
| Pressure in growth atmosphere | ×10$^3$ Pa | 90 |
| Temperature of base | ° C. | 735 |

Furthermore, it has been found from various experiments that at a constant growth rate of the active layer, if the temperature of the base increases by 10° C., the value x in In$_x$Ga$_{(1-x)}$N constituting the active layer decreases, and the luminescence wavelength of the GaN semiconductor light-emitting element composed of the resulting LED is shortened by about 40 nm. Consequently, by setting the growth rate of the In$_x$Ga$_{(1-x)}$N layer constituting the active layer at 0.3 nm/sec or more, and preferably at 0.6 nm/sec or more and by appropriately selecting and controlling the temperature of the base, the value x in the In$_x$Ga$_{(1-x)}$N layer constituting the active layer can be stabilized and a GaN semiconductor light-emitting element which emits light at a desired wavelength can be obtained. Furthermore, In$_x$Ga$_{(1-x)}$N layers constituting active layers were subjected to crystal growth while the pressure in the growth atmosphere (pressure in the MOCVD system) during crystal growth of the active layers by means of MOCVD was varied from 1×10$^3$ Pa to 9×10$^4$ Pa, with the other conditions being the same as in Condition-4. The resulting In$_x$Ga$_{(1-x)}$N layers had substantially the same value x.

In general, crystal growth of a GaN compound semiconductor layer whose top face corresponds to the A plane can be performed on the R plane of a sapphire substrate. However, the resulting GaN compound semiconductor layer has an extremely large number of crystal defects, and the surface thereof has irregularities. Therefore, if an active layer composed of a GaN compound semiconductor is formed directly on the GaN compound semiconductor layer, the irregularities increase and the luminescence of the resulting GaN semiconductor light-emitting element becomes extremely weak.

In the method for manufacturing the GaN semiconductor light-emitting element in Example 1, since the first underlying layer is subjected to lateral epitaxial growth in the Y direction from the seed layer, first, basically, a first underlying layer having an extremely low crystal defect density can be obtained. However, the crystal defect density of a portion of the first underlying layer grown on the seed layer is high. Therefore, the second underlying layer is formed on the top face of the first underlying layer in a state that the portion of the first underlying layer having a high crystal defect density grown on the seed layer is covered with the mask layer. As a result, the crystal defect density in the resulting second underlying layer as a whole is extremely low.

Moreover, the top face of the second underlying layer thus obtained corresponds to the A plane, and the side face thereof corresponds to the C plane or the like. Accordingly, in each of the first GaN compound semiconductor layer, the active layer, and the second GaN compound semiconductor layer which are formed in that order on the second underlying layer as a base, the top face thereof also corresponds to the A plane, and the side face thereof (e.g. C plane) is perpendicular to the interfaces. Consequently, even if piezoelectric spontaneous polarization occurs in the active layer, the piezoelectric spontaneous polarization occurs in a direction at a right angle to the thickness direction of the active layer. Therefore, it is possible to prevent the occurrence of phenomena, such as a shift in luminescence wavelength, a decrease in luminous efficiency, an increase in operating voltage, and saturation in luminance.

As a variation of Example 1, it may be possible to employ a method for manufacturing a GaN semiconductor light-emitting element which does not include the step of forming a mask layer 13. In such a case, after Step-110, Step-130 and thereafter are performed without performing Step-120. In such a case, since there is a possibility of occurrence of crystal defects in the portion of the second underlying layer 14 located above the seed layer 11, preferably, a structure is formed in which a coating layer, for example, composed of $SiO_2$, is provided on a portion of the second GaN compound semiconductor layer above such a portion of the second underlying layer 14, and a second electrode is not formed on the portion of the second GaN compound semiconductor layer of the second conductivity type so that a current is not allowed to flow through each of the portion of the first GaN compound semiconductor layer of the first conductivity type and the portion of the second GaN compound semiconductor layer of the second conductivity type located above such a portion of the second underlying layer 14.

EXAMPLE 2

Example 2 is a variation of Example 1. In Example 1, lateral epitaxial growth of the first underlying layer 12 is stopped when facing side faces 12B of the two adjacent first underlying layers 12 come into contact with each other. In a GaN compound semiconductor crystal, the coefficient of thermal expansion in the c-axis direction is extremely smaller than the coefficient of thermal expansion of a sapphire substrate. Consequently, in some cases, due to a large change in temperature, the seed layer 11 and the first underlying layer 12 may be detached from the sapphire substrate 10.

In Example 2, in the step similar to Step 110 of Example 1, a first underlying layer 12 is allowed to epitaxially grow laterally in the Y direction from each seed layer 11 and the lateral epitaxial growth is stopped before facing side faces 12B of the two adjacent first underlying layers 12 come into contact with each other. In the step similar to Step 130 of Example 1, second underlying layers 14 are allowed to epitaxially grow laterally in the Y direction, and also third underlying layers 15 are allowed to epitaxially grow laterally in the Y direction from the facing side faces 12B of the two adjacent first underlying layers 12. Thus, in the step similar to Step-110 of Example 1, it is possible to reliably prevent the first underlying layer 12 and the seed layer 11 from being detached from the sapphire substrate 10 due to the difference in the coefficient of thermal expansion when the temperature of the sapphire substrate 10 is increased in order to form mask layers 13.

The method for manufacturing the GaN semiconductor light-emitting element in Example 2 will be described below with reference to FIGS. 4A to 4D, which are each a schematic end elevation of a sapphire substrate, etc.

[Step-200]

Figure 4A:
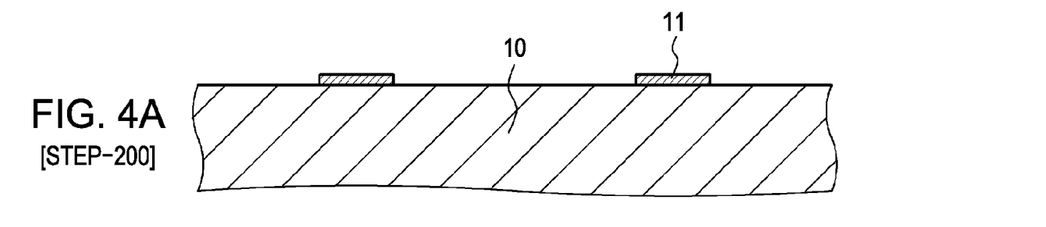
FIGS. 4A to 4D are each a schematic end elevation of a sapphire substrate, etc. for describing a process for manufacturing a GaN semiconductor light-emitting element in Example 2.

First, as in Step-100 of Example 1, a plurality of strip-shaped seed layers 11 composed of a GaN compound semiconductor are formed discretely on the R plane of a sapphire substrate 10 so as to extend in the X direction (refer to FIG. 4A).

[Step-210]

Figure 4B:
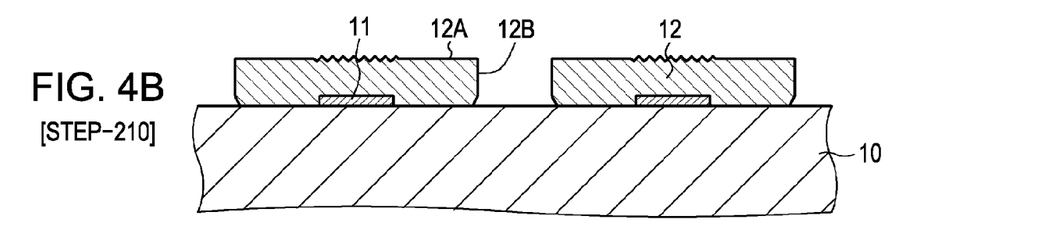

Subsequently, lateral epitaxial growth of a first underlying layer 12 is performed from the top face of each seed layer 11 in the Y direction, a top face 12A of the first underlying layer 12 corresponding to the A plane, a side face 12B of the first underlying layer 12 corresponding to the C plane (refer to FIG. 4B). In Example 2, the first underlying layer 12 is subjected to lateral epitaxial growth in the Y direction from each seed layer 11, and the lateral epitaxial growth is stopped before facing side faces 12B of the two adjacent first underlying layers 12 come into contact with each other. Specifically, the same step as Step-110 of Example 1 is carried out except that the crystal growth time is shortened compared to Example 1.

[Step-220]

Figure 4C:
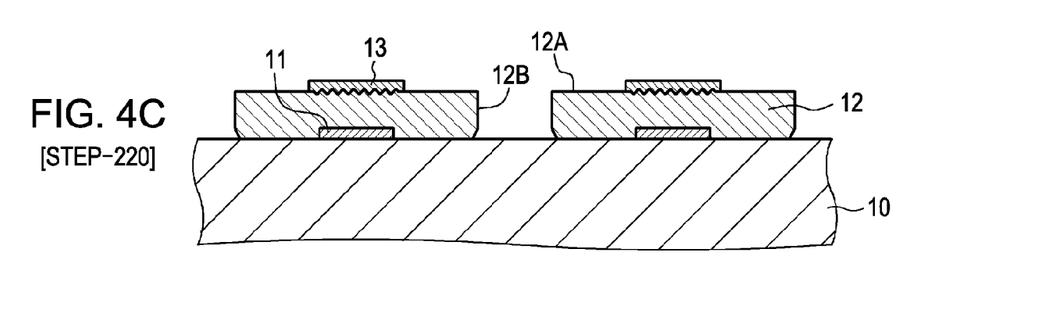

Subsequently, as in Step-120 of Example 1, a mask layer 13 is formed on the top face 12A of a portion of the first underlying layer 12 located above each seed layer 11 (refer to FIG. 4C).

[Step-230]

Figure 4D:
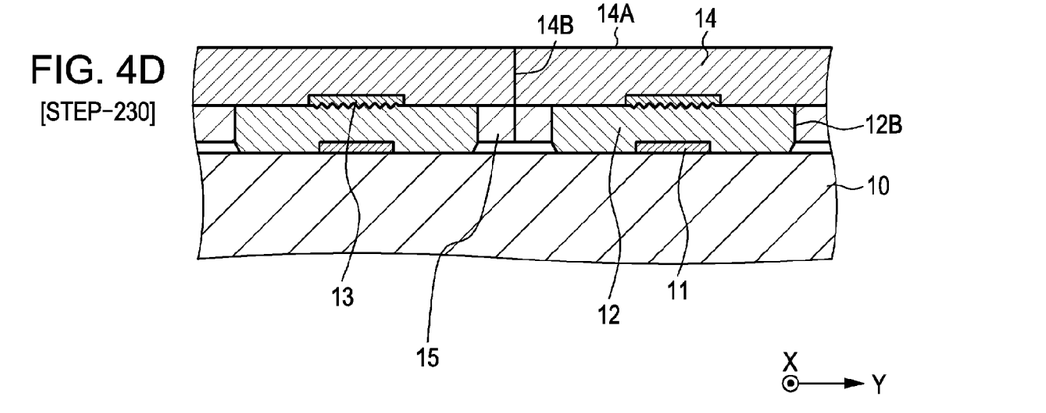

Subsequently, as in Step-130 of Example 1, lateral epitaxial growth of a second underlying layer 14 is performed from the top face 12A of each first underlying layer 12 in the Y direction, and also third underlying layers 15 are allowed to epitaxially grow laterally in the Y direction from the facing side faces 12B of the two adjacent first underlying layers 12 (refer to FIG. 4D).

In such a manner, the base which is the nonpolar plane and which is composed of the second underlying layer 14 can be obtained.

[Step-240]

Subsequently, by carrying out the same steps as Step-140 to Step-170 of Example 1, a GaN semiconductor light-emitting element can be obtained.

In Example 2, in Step-210, the first underlying layer 12 is subjected to lateral epitaxial growth in the Y direction from the top face of each seed layer 11, and the lateral epitaxial growth is stopped before facing side faces 12B of the two adjacent first underlying layers 12 come into contact with each other. Consequently, for example, it is possible to reliably prevent the seed layer 11 and the first underlying layer 12, which are each composed of a GaN compound semiconductor, from being detached from the sapphire substrate 10 due to the difference in the coefficient of thermal expansion when the temperature of the sapphire substrate 10 is increased in order to form mask layers 13.

EXAMPLE 3

Example 3 is a variation of Example 2. Example 3 differs from Example 2 mainly in that, in particular, the feed rate of the nitrogen source gas (specifically, ammonia gas) is increased with respect to the crystal growth conditions when the first underlying layer 12 is subjected to lateral epitaxial growth in the Y direction from each seed layer 11.

[Step-300]

First, as in Step-100 of Example 1, a plurality of strip-shaped seed layers 11 composed of a GaN compound semiconductor are formed discretely so as to extend in the X direction. In Example 3, the width $W_S$ is 6 µm and the pitch $P_S$ is 24 µm.

[Step-310]

Subsequently, lateral epitaxial growth of a first underlying layer 12 is performed from the top face of each seed layer 11 in the Y direction, a top face 12A of the first underlying layer 12 corresponding to the A plane, a side face 12B of the first underlying layer 12 corresponding to the C plane, as in Step-210 of Example 2. In Example 3, as in Example 2, the first underlying layer 12 is subjected to lateral epitaxial growth in the Y direction from the top face of each seed layer 11, and the lateral epitaxial growth is stopped before facing side faces 12B of the two adjacent first underlying layers 12 come into contact with each other. Specifically, the same step as Step-110 of Example 1 is carried out except that the crystal growth time is shortened compared to Example 1. Under the crystal growth conditions shown in Table 1, depending on the case, the resulting first underlying layer 12 may have a large number of point defects, and a large amount of carbon in the organogallium source gas may be incorporated into the first underlying layer 12, resulting in an increase in yellow light emission. Therefore, in Example 3, the feed rate of the nitrogen source gas (specifically, ammonia gas) in Table 1 has been changed from 1 SLM to 2 SLM. Under the crystal growth conditions for the first underlying layer 12 shown in Example 1, the lateral growth rate is high and the feed rate of the nitrogen source gas is low. Thus, in some cases, the first underlying layer 12 may be colored with brown. Under the crystal growth conditions for the first underlying layer 12 in Example 3, the first underlying layer 12 is not colored and is transparent. Moreover, by setting the feed rate of the nitrogen source gas at 2 SLM, the lateral growth rate is relatively decreased, and there is a tendency that the facing side faces 12B of the two adjacent first underlying layers 12 do not easily come into contact with each other.

[Step-320]

Subsequently, as in Step-120 of Example 1, a mask layer 13 is formed on the top face 12A of a portion of the first underlying layer 12 located above each seed layer 11. The width WM of the mask layer 13 whose planar shape is strip-like is 9 µm. That is, the projection of the seed layer 11 is contained in the projection of the mask layer 13, and $W_M/W_S=1.5$.

[Step-330]

Subsequently, as in Step-130 of Example 1, lateral epitaxial growth of a second underlying layer 14 is performed from the top face 12A of each first underlying layer 12 in the Y direction, and also third underlying layers 15 are allowed to epitaxially grow laterally in the Y direction from the facing side faces 12B of the two adjacent first underlying layers 12.

In such a manner, the base which is the nonpolar plane and which is composed of the second underlying layer 14 can be obtained.

[Step-340]

Subsequently, by carrying out the same steps as Step-140 to Step-170 of Example 1, a GaN semiconductor light-emitting element can be obtained.

EXAMPLE 4

Example 4 relates to a method for manufacturing a GaN semiconductor light-emitting element according to the second structure of the embodiment of the present invention. A method for manufacturing a GaN semiconductor light-emitting element in Example 4 will be described below.

[Step-400]

First, a GaN bulk substrate whose top face is the A plane is prepared by cutting a GaN substrate with a dicer. Subsequently, the top face of the resulting GaN substrate is polished, for example, using a CMP technique, and thus it is possible to obtain a smooth, bulk GaN substrate whose top face is the A plane as a base. If there are regions in which the polarity is reversed in the surface of the GaN substrate, preferably, a GaN semiconductor light-emitting element is manufactured avoiding such regions.

[Step-410]

Subsequently, the GaN substrate is placed into an MOCVD system, and as in Step-140 of Example 1, a first GaN compound semiconductor layer of a first conductivity type (specifically, for example, a GaN layer doped with Si with a thickness of about 1 µm), an active layer composed of $In_xGa_{(1-x)}N$ (specifically, for example, an active layer having the same structure as that of the active layer described in Example 1), and a second GaN compound semiconductor layer of a second conductivity type (specifically, for example, an AlGaN layer doped with Mg with a thickness of 5 to 20 nm and a GaN layer doped with Mg with a thickness of 100 nm) are formed, by crystal growth, in that order on the top face (A plane) of the GaN substrate by means of MOCVD.

[Step-420]

Subsequently, as in Step-150 of Example 1, a second electrode is formed on the second GaN compound semiconductor layer of a second conductivity type (specifically, p type). The second electrode has a laminate structure of Ni layer/Ag layer/Au layer and can be formed by vacuum deposition. Subsequently, a first electrode is formed on the reverse face of the GaN substrate. The first electrode has a laminate structure of Ti layer/Au layer and can be formed by vacuum deposition. Furthermore, a transparent electrode composed of ITO connected to the first electrode is formed. Then, by cleaving the GaN substrate, the individual GaN semiconductor light-emitting elements are separated. Thus, a GaN semiconductor light-emitting element (LED) can be obtained. Mounting of the resulting LED chip is performed such that the transparent electrode is positioned at the top, and wiring and resin molding are performed. Thus, a GaN semiconductor light-emitting element composed of a shell-shaped LED can be obtained.

The present invention has been described based on the preferred embodiments. However, it is to be understood that the present invention is not limited to the embodiments. The types, compositions, thicknesses, structures, etc., of the substrate, the active layer, and the various GaN compound semiconductor layers are merely examples, and can be changed appropriately. Furthermore, the conditions, the numerical values, and the materials used described in the embodiments are merely examples, and can be changed appropriately.

Figure 5:
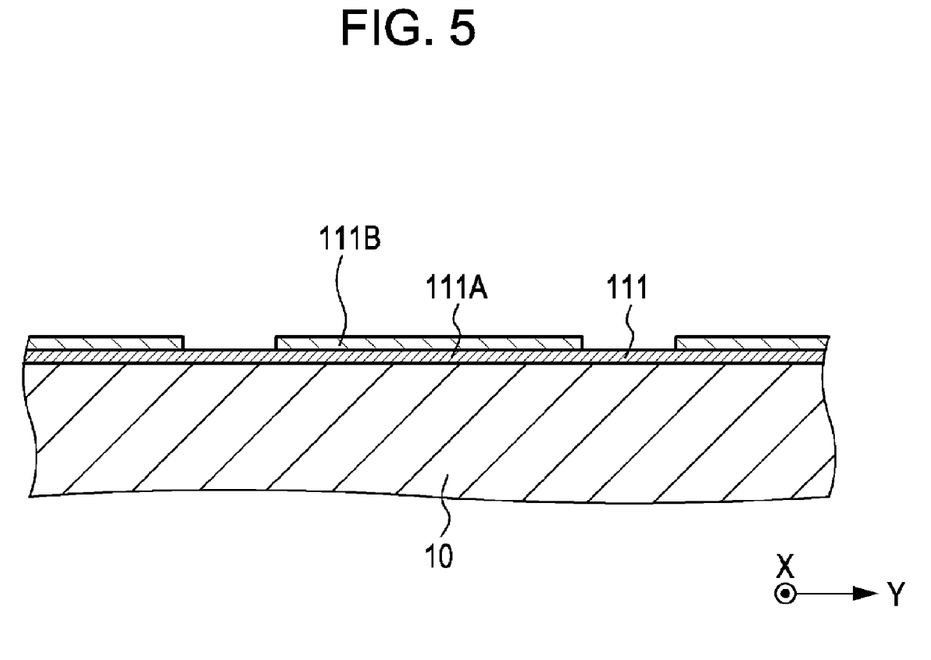
FIG. 5 is a schematic end elevation of a sapphire substrate, etc. for the variation of the method for forming the seed layer in the method for manufacturing the GaN semiconductor light-emitting element in Examples 1 to 3.

In each of Examples 1 to 3, the seed layers 11 composed of a GaN compound semiconductor are formed by a process in which a GaN compound semiconductor layer whose top face corresponds to the A plane is formed on the R plane of the sapphire substrate 10, and then patterning is performed on the GaN compound semiconductor layer using lithography and etching. However, the formation process of the seed layers 11 is not limited to such a process. As shown in FIG. 5, which is a schematic end elevation of a sapphire substrate 10, etc., seed layers 111 composed of a GaN compound semiconductor may be obtained by a process in which a GaN compound semiconductor layer 111A (e.g., a GaN layer whose top face corresponds to the A plane) is formed on the R plane of the sapphire substrate 10, a non-growing layer (a layer on which a GaN compound semiconductor layer does not grow) 111B is formed, and then patterning is performed on the non-growing layer 111B to expose strip-shaped GaN compound semiconductor layers 111A extending in the X direction (more specifically, in the <1-100>direction.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A method for manufacturing a GaN semiconductor light-emitting element comprising:
    forming, by crystal growth,
    a first GaN compound semiconductor layer of a first conductivity type, the top face of which corresponds to the A plane,
    an active layer composed of $In_xGa_{(1-x)}N$, the top face of which corresponds to the A plane, and
    a second GaN compound semiconductor layer of a second conductivity type, the top face of which corresponds to the A plane,
    in that order on a base which is a nonpolar plane,
    wherein the active layer is formed at a crystal growth rate of 0.3 nm/sec or more,
    wherein the first GaN compound semiconductor layer, the active layer, and the second GaN compound semiconductor layer are formed in that order using metal-organic chemical vapor deposition,
    wherein during the crystal growth of the active layer using metal-organic chemical vapor deposition, the feed rate per square centimeter of the base per minute of an In source gas is set at $5 \times 10^{-7}$ mol·cm$^{-2}$·min$^{-1}$ or more, and
    wherein during the crystal growth of the active layer using metal-organic chemical vapor deposition, the temperature of the base is set at 700° C. to 800° C.

2. The method for manufacturing the GaN semiconductor light-emitting element according to claim 1, wherein the active layer is formed at a crystal growth rate of 0.6 nm/sec or more.

3. The method for manufacturing the GaN semiconductor light-emitting element according to claim 1, wherein the relationship $0.05 \leq x \leq 0.3$ is satisfied.

4. The method for manufacturing the GaN semiconductor light-emitting element according to claim 1, wherein during the crystal growth of the active layer using metal-organic chemical vapor deposition, the feed rate per square centimeter of the base per minute of a Ga source gas is set at $7 \times 10^{-7}$ mol·cm$^{-2}$·min$^{-1}$.

5. The method for manufacturing the GaN semiconductor light-emitting element according to claim 1, wherein the base is composed of an underlying layer formed of a GaN compound semiconductor, the top face of the underlying layer corresponding to the A plane, the underlying layer being formed on a substrate.

6. The method for manufacturing the GaN semiconductor light-emitting element according to claim 5, further comprising:
    discretely forming a plurality of strip-shaped seed layers composed of a GaN compound semiconductor so that the seed layers extend in the X direction on the R plane of a sapphire substrate;
    performing lateral epitaxial growth of a first underlying layer composed of a GaN compound semiconductor in the Y direction from each seed layer, the top face of the first underlying layer corresponding to the A plane;
    forming a mask layer on the top face of the first underlying layer in a region located above each seed layer; and
    performing lateral epitaxial growth of a second underlying layer composed of a GaN compound semiconductor in the Y direction from the top face of the first underlying layer in the Y direction over the top face of the first underlying layer and the mask layer, the top face of the second underlying layer corresponding to the A plane,
    wherein the second underlying layer corresponds to the underlying layer.

7. The method for manufacturing the GaN semiconductor light-emitting element according to claim 1, wherein the base is composed of a GaN substrate whose top face is the A plane.

* * * * *